US011500561B1

(12) United States Patent
Spirkl et al.

(10) Patent No.: US 11,500,561 B1
(45) Date of Patent: Nov. 15, 2022

(54) MASKED TRAINING AND ANALYSIS WITH A MEMORY ARRAY

(71) Applicant: Micron Technology, Inc., Boise, ID (US)

(72) Inventors: Wolfgang Anton Spirkl, Germering (DE); Phillip A. Rasmussen, Boise, ID (US); Thomas Hein, Munich (DE)

(73) Assignee: Micron Technology, Inc., Boise, ID (US)

( * ) Notice: Subject to any disclaimer, the term of this patent is extended or adjusted under 35 U.S.C. 154(b) by 16 days.

(21) Appl. No.: 17/306,559

(22) Filed: May 3, 2021

(51) Int. Cl.
*G06F 3/06* (2006.01)

(52) U.S. Cl.
CPC .......... *G06F 3/0634* (2013.01); *G06F 3/0604* (2013.01); *G06F 3/0679* (2013.01)

(58) Field of Classification Search
CPC ..... G06F 3/0634; G06F 3/0679; G06F 3/0604
See application file for complete search history.

(56) References Cited

U.S. PATENT DOCUMENTS

| | | | |
|---|---|---|---|
| 8,022,726 B2* | 9/2011 | Candage | H03K 19/0002 323/283 |
| 2004/0062319 A1* | 4/2004 | Casper | H04L 25/4917 375/353 |
| 2006/0170453 A1* | 8/2006 | Zerbe | H04L 7/0331 326/37 |
| 2019/0199560 A1* | 6/2019 | Bossard | H04L 25/4902 |
| 2019/0229749 A1* | 7/2019 | Sudhakaran | H03M 5/145 |

* cited by examiner

*Primary Examiner* — Mark A Giardino, Jr.
(74) *Attorney, Agent, or Firm* — Holland & Hart LLP

(57) ABSTRACT

Methods, systems, and devices for masked training and analysis with a memory array are described. A memory device may operate in a first mode in which a maximum transition avoidance (MTA) decoder for a memory array of the memory device is disabled. During the first mode, the memory device may couple an input node of the MTA decoder with a first output node of a first decoder, such as a first pulse amplitude modulation (PAM) decoder. The memory device may operate in a second mode in which the MTA decoder for the memory array is enabled. During the second mode, the memory device may couple the input node of the MTA decoder with a second output node of a second decoder, such as a second PAM decoder.

30 Claims, 7 Drawing Sheets

MASKED TRAINING AND ANALYSIS WITH A MEMORY ARRAY

FIELD OF TECHNOLOGY

The following relates generally to one or more systems for memory and more specifically to masked training and analysis with a memory array.

BACKGROUND

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

A memory device may support multiple operating modes, such a mission mode in which the memory device responds to user data requests from another device, a training mode in which the memory device trains (e.g., calibrates) one or more aspects of the memory device, and an analysis mode in which the memory device determines (e.g., characterizes) various aspects of the memory device, among other operating modes. The training mode and analysis mode may be referred to generally as support modes and may involve receiver masking, as describe more herein. In a support mode, the memory device may operate on data sequences that facilitate training or analysis. Because receiver masking may generate data that is incompatible with a maximum transition avoidance (MTA) decoder for a memory array of the memory device (e.g., a main memory array that stores user data), the memory device may store the data sequences in other memory arrays (e.g., one or more secondary memory arrays) that support MTA-non-compliant data. But capacity limitations of the secondary memory arrays may limit the data sequences to inefficient sizes, which may decrease the efficacy of the support modes.

According to the techniques described herein, a memory device may improve support mode efficacy, among other benefits, by strategically configuring the MTA decoder to support MTA-non-compliant data, which may allow use of the main memory array to store relatively long data sequences (relative to other techniques) in the support modes. For example, the memory device may device may disable the MTA decoder so that the MTA decoder passes MTA-non-compliant data to the main memory array without performing MTA decoding. To ensure that meaningful receiver information is passed to the main memory array, among other advantages, the memory device may use a switching circuit to change (e.g., relative to the mission mode along with other examples) the coupling between the MTA decoder and one or more receivers of the memory device.

Features of the disclosure are initially described in the context of systems and dies as described with reference to FIG. 1. Features of the disclosure are described in the context of a memory device as described with reference to FIGS. 2-4. These and other features of the disclosure are further illustrated by and described with reference to an apparatus diagram and flowcharts that relate to masked training and analysis with a memory array as described with reference to FIGS. 5-7.

Figure 1:
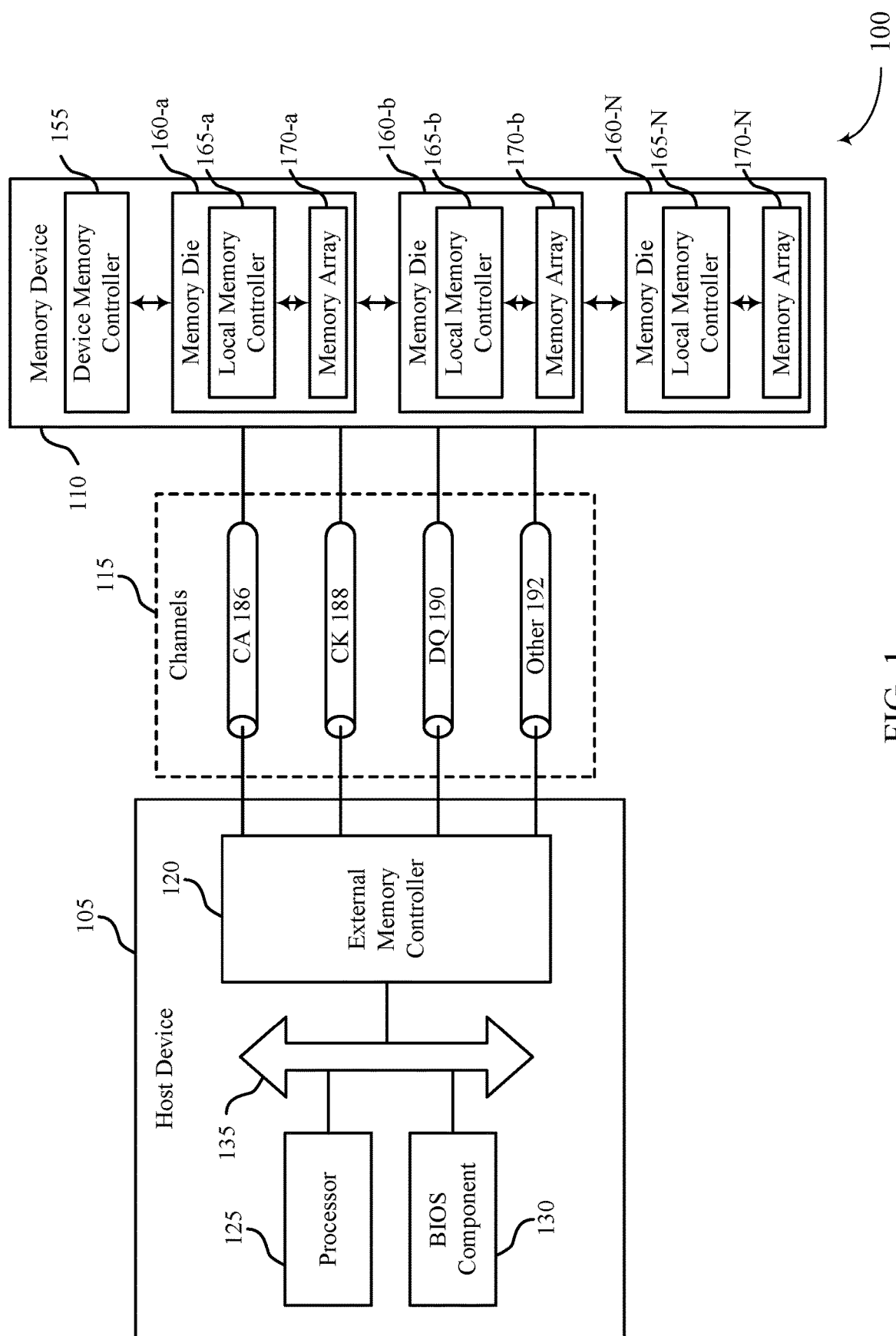
FIG. 1 illustrates an example of a system that supports masked training and analysis with a memory array in accordance with examples as disclosed herein.

FIG. 1 illustrates an example of a system 100 that supports masked training and analysis with a memory array in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, data channels 190 may be operable to communicate one or more of data or control information between the host device 105 and the memory device 110. For example, the data channels 190 may communicate information (e.g., bi-directional) to be written to the memory device 110 or information read from the memory device 110.

Signals communicated over the channels 115 may be modulated using one or more different modulation schemes. In some examples, a binary-symbol (or binary-level) modulation scheme may be used to modulate signals communicated between the host device 105 and the memory device 110. A binary-symbol modulation scheme may be an example of a M-ary modulation scheme where M is equal to two. Each symbol of a binary-symbol modulation scheme may be operable to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some examples, a multi-symbol (or multi-level) modulation scheme may be used to modulate signals communicated between the host device 105 and the memory device 110. A multi-symbol modulation scheme may be an example of a M-ary modulation scheme where M is greater than or equal to three. Each symbol of a multi-symbol modulation scheme may be operable to represent more than one bit of digital data (e.g., a symbol may represent a logic 00, a logic 01, a logic 10, or a logic 11). Examples of multi-symbol modulation schemes include, but are not limited to, PAM3, PAM4, PAM8, etc., quadrature amplitude modulation (QAM), quadrature phase shift keying (QPSK), and/or others. A multi-symbol signal (e.g., a PAM3 signal or a PAM4 signal) may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

So, a memory device 110 may use a modulation scheme, such as pulse amplitude modulation (PAM), to modulate data for efficient signaling. As noted, the memory device 110 may use PAM4 signaling which includes four voltage levels each associated with a respective symbol that represents multiple (e.g., two) bits. For example, the lowest PAM4 voltage level (e.g., −3) may be associated with a first symbol (e.g., symbol 0) that represents a first multi-bit logic value (e.g., '00'), the second lowest PAM4 voltage level (e.g., −1) may be associated with a second symbol (e.g., symbol 1) that represents a second multi-bit logic value (e.g., '01'), the second highest PAM4 voltage level (e.g., +1) may be associated with a third symbol (e.g., symbol 2) that represents a third multi-bit logic value (e.g., '10'), and the highest voltage level (e.g., +3) may be associated with a fourth symbol (e.g., symbol 3) that represents a fourth multi-bit logic value (e.g., '11').

To reduce issues that arise from extreme changes in PAM4 voltage levels during signaling, or for other reasons, the memory device 110 may also use a coding scheme, such as maximum transition avoidance (MTA) coding. MTA coding may prevent consecutive PAM4 symbols from having logic values that result in a data signal transitioning a threshold amount, such as three voltage levels (e.g., MTA coding may prevent adjacent PAM4 symbols from transitioning from the lowest voltage level to the highest voltage level, and vice versa). Because certain symbol combinations are not permitted in MTA coding, MTA coding may use an extra symbol to compensate for the otherwise-prohibited combinations. For example, MTA coding may translate eight symbols into nine symbols (or, put another way, sixteen bits into eighteen bits), where the additional symbol (e.g., additional bits) may be referred to as a supplemental symbol or an MTA symbol.

In some examples, memory device 110 may operate in a support mode (e.g., a training mode, an analysis mode) in which data sequences (e.g., "patterns") are circulated through a receive path of the memory device 110, a transmit path of the memory device 110, or both. A training mode may refer to a mode in which the memory device 110 calibrates various voltages and timing parameters of the memory device 110. An analysis mode may refer to a mode in which the memory device 110 characterizes various components of the memory device 110. A data sequence used in a support mode may be referred to herein as a support mode data sequence.

During a support mode, the memory device 110 may implement receiver masking which allows the memory device 110 to train or analyze receivers on a sub-receiver basis using the support mode data sequences. The memory device 110 may store the support mode data sequences in designated separate memory arrays, referred to as secondary memory arrays, that are configured to operate on MTA-noncompliant data, which may be generated by masked receivers. However, the secondary memory arrays may in some examples have limited capacity relative to a main memory array that is used to store user data, among other types of data, and that receives data through an MTA decoder configured to operate on MTA-compliant data. Storing the preconfigured data sequences in the limited-capacity secondary memory arrays may limit the size of the preconfigured data sequences, which may negatively impact training or analysis.

According to the techniques described herein, the memory device 110 may increase the size of support mode data sequences—and thereby improve the efficacy of support modes—by storing the support mode data sequences in one or more main memory arrays. To ensure compatibility with MTA-non-compliant data that is generated during the support mode, the memory device 110 may be configured to strategically disable the MTA decoder for the main memory array(s) and couple the MTA decoder with the masked receivers as described herein. The memory device 110 may also be configured to strategically couple the MTA encoder for the main memory array(s) with the main memory array(s) as described herein.

Figure 2:
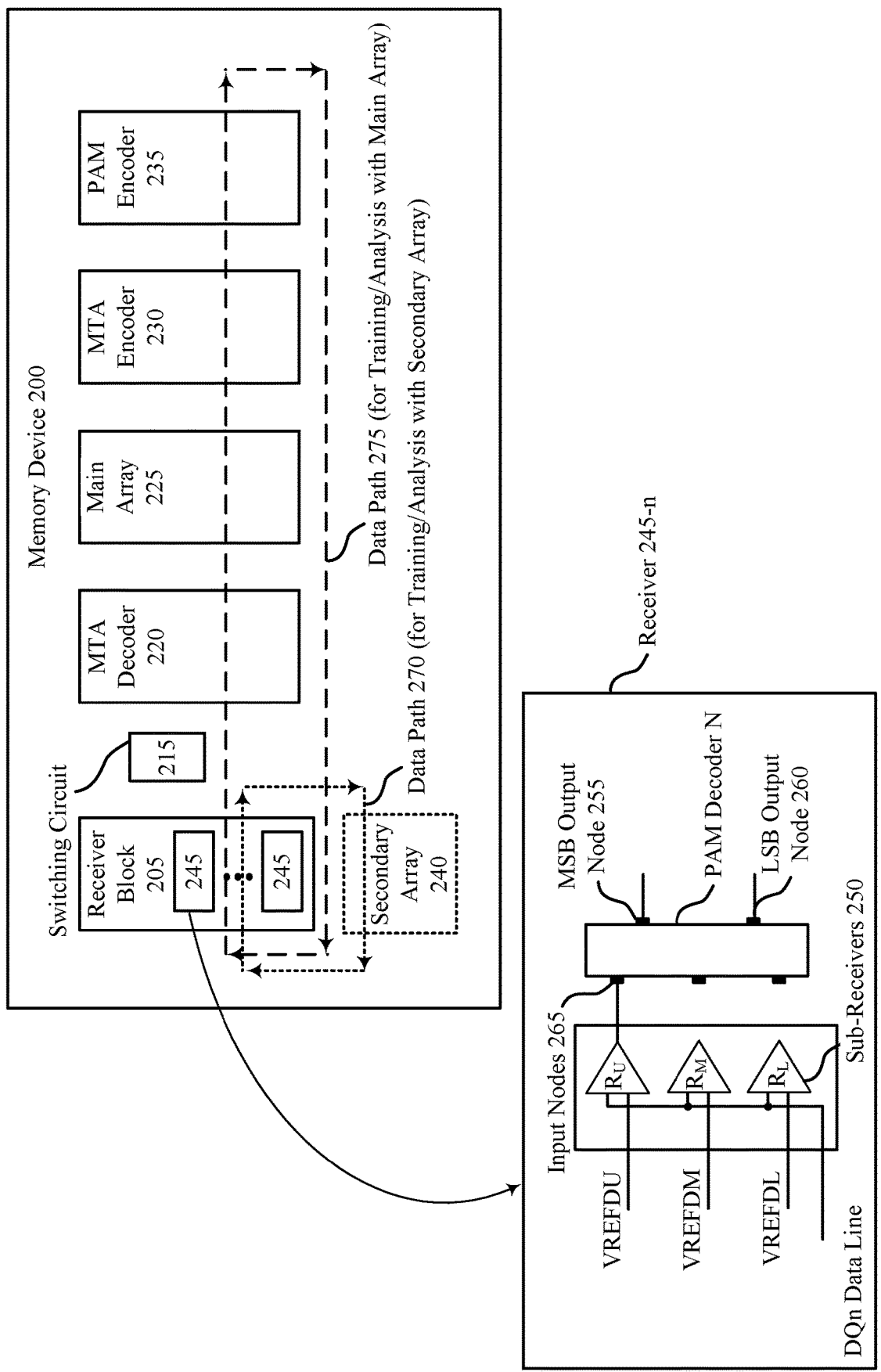
FIG. 2 illustrates an example of a memory device that supports masked training and analysis with a memory array in accordance with examples as disclosed herein.

FIG. 2 illustrates an example of a memory device 200 that supports masked training and analysis with a memory array in accordance with examples as disclosed herein. The memory device 200 may be an example of the memory device 110 as described with reference to FIG. 1. The memory device 200 may support, among other examples, one or more support modes and a mission mode as described herein. The memory device 200 may store support mode data sequences in the main array 225, which may allow the memory device 200 to increase the size of the support mode data sequences relative to other techniques, such as those that store support mode data sequences in one or more of the secondary array(s) 240. To ensure that the MTA decoder 220 passes meaningful data to the main array 225 in the support mode, the memory device 200 may use the switching circuit 215 to strategically couple the MTA decoder 220 with output nodes of PAM decoders included in the receiver block 205. Meaningful data may refer to data received from an enabled sub-receiver 250 (and that therefore provides information about, or reflects characteristics of, that sub-receiver 250). The memory device 200 may also strategically enable and disable various components of the memory device 200 as described herein.

The PAM decoders may be configured to perform PAM decoding (e.g., "demodulation"), the MTA decoder 220 may be configured to perform MTA decoding, the MTA encoder 230 may be configured to perform MTA coding (also referred to as MTA encoding), and the PAM encoder 235 may be configured to perform PAM modulation (as referred to as PAM coding or PAM encoding).

The functionality of the receiver block 205 is described followed by a description of the memory device 200 in various operating modes.

The receiver block 205 may be configured to receive data symbols (e.g., PAM-modulated data symbols, MTA-encoded data symbols) and generate one or more bits, such as a least significant bit (LSB) and a most significant bit (MSB), for each data symbol. The receiver block 205 may include multiple receivers 245, one of which is illustrated in detail as receiver 245-n. The receivers 245 may receive respective data symbols in parallel over respective data lines, which may also be referred to as DQ lines.

The receivers 245 in the receiver block 205 may be operated in at least a first mode, such as a non-masking mode, or in second mode, such as a masking mode (which may also be referred to as a sub-receiver masking mode or a receiver masking mode). For ease of reference, the non-masking mode and the masking mode are described with reference to receiver 245-n. However, the description is generally applicable to any other receivers, including those in the receiver block 205.

In the non-masking mode, which may be used in a mission mode, the receiver block 205 may operate on user data and each sub-receiver 250 in receiver 245-n may be coupled with a respective input node 265 of the PAM decoder N. The sub-receivers 250 may include a sub-receiver (denoted Ru) configured to compare the voltage level of an incoming data symbol (DQ) with a highest reverence voltage (e.g., VREFDU), a sub-receiver (denoted $R_M$) configured to compare the voltage level of the incoming data symbol to an intermediate reference voltage (e.g., VREFDM), and a sub-receiver (denoted $R_L$) configured to compare the voltage level of the incoming data symbol to a lowest reference voltage (e.g., VREFDL). The receiver 245-n may operate on data symbols received over a data line (e.g., DQn data line) coupled with the receiver 245-n. Each sub-receiver 250 may output a voltage level indicative of a logic value to the PAM decoder N based on, for example, the comparison result for the data symbol (e.g., a sub-receiver 250 may output a logic 0 if the voltage level of the data symbol is lower than the reference voltage and may output a logic 1 if the voltage level of the data symbol is higher than the reference voltage). The PAM decoder N may generate the LSB and MSB of the data symbol based on the logic values received from the sub-receivers 250. The LSB and MSB may be generated on respective output nodes (e.g., the MSB output node 255 and the LSB output node 260). Thus, the PAM decoder N may perform PAM demodulation.

In the masking mode, which may be used in a support mode, the receiver block 205 may operate on support mode data sequences and, in some examples, a single sub-receiver 250 (referred to as the enabled sub-receiver) in receiver 245-n may be coupled with an input node 265 of the PAM decoder N (as shown in FIG. 2). Specifically, the enabled sub-receiver 250 may be coupled with the input node for the MSB data path so that the MSBs generated at the MSB output node 255 are reflect characteristics of the enabled sub-receiver 250. The other sub-receivers in receiver 245-n (which may also be referred to as disabled sub-receivers) may be isolated from the PAM decoder N. In the illustrated example, sub-receiver Ru is enabled so the output of sub-receiver Ru is coupled with the PAM decoder N and the other sub-receivers are isolated (e.g., via switching components) from the PAM decoder N although other configurations and examples are specifically contemplated. The LSB output node 260 may be fixed (e.g., forced) as a logic 1, and thus the LSBs generated by the receiver 245-n may not carry meaningful data for the sub-receivers 250 during the support mode. That is, the LSBs may not reflect characteristics of the sub-receivers 250 because the LSBs are generated independent of the sub-receivers 250. Thus, in the receiver masking mode, a single sub-receiver 250 may be isolated for training or analysis (which may be based on support mode data sequences).

Because the LSB output node 260 is fixed as a logic 1 during the receiver masking mode, the receiver 245-n may generate data that is MTA-non-compliant (e.g., data that violates MTA principles or is incompatible with MTA decoding). To accommodate MTA-non-compliant data, some memory devices may circulate support mode data sequences through one or more secondary arrays 240, which, unlike the main array 225, do not rely on an MTA decoder to receive data. If a memory device uses the secondary array(s) to store support mode data sequences, the support mode data sequences may propagate through the memory device as shown by the data path 270 with short dashes. But, as noted, the limited capacity of the secondary array(s) may restrict the size of the support mode data sequences, which may impair the efficacy of the support modes.

According to the techniques described herein, the memory device 200 may increase the size of support mode data sequences by using the main array 225 (which may have a larger capacity than the secondary arrays 240) to store the support mode data sequences. To do so, the memory device 200 may use the switching circuit 215 to be configured to strategically couple the MTA decoder 220 with the receiver block 205 (so that meaningful data bits are passed to the MTA decoder 220) and disable the MTA decoder 220 (so that data bits are passed to the main array 225 without MTA decoding). These aspects are described with more detail herein, including with respect to FIG. 3. If the memory device 200 uses the main array 225 to store support mode data sequences, the support mode data sequences may propagate through the memory device 200 (e.g., circulate through the receiver block 205, the MTA decoder 220, the main array 225, the MTA encoder 230, and the PAM encoder 235) as shown by the data path 275 with long dashes.

The general configuration and operation of the memory device 200 during the mission mode and during a support mode are now described.

During the mission mode, the receiver block 205 may be operated in the non-masking mode, the MTA decoder 220 may be enabled, the MTA encoder 230 may be enabled, and the switching circuit 215 may be configured so that a first coupling is established between the receiver block 205 and the MTA decoder 220. The receiver block 205 may receive PAM-modulated and MTA-encoded data symbols representing user data and may generate one or more (e.g., pairs) of data bits (e.g., an LSB and an MSB) for each data symbol. For example, the receiver block 205 may receive a one or more (e.g., a burst) of data symbols (e.g., nine data symbols, one per receiver 245) in parallel and generate an LSB/MSB pair for each data symbol. The data symbols may include a set of data symbols (e.g., eight data symbols denoted DQ0 through DQ8) encoded with MTA coding and an additional MTA data symbol (denoted DQX) that results from the MTA encoding. Thus, in one example, the receiver block 205 may generate eighteen bits (nine LSB/MSB pairs) from nine data symbols.

The enabled MTA decoder 220 may receive the LSB/MSB pairs from the receiver block 205, perform MTA decoding on the LSB/MSB pairs, and communicate the decoded data bits to the main array 225 for storage. Continuing this example, the MTA decoder 220 may receive nine LSB/MSB pairs from the receiver block 205, decode the nine LSB/MSB pairs to produce sixteen data bits, and communicate the sixteen data bits to the main array 225 for storage. So, during the mission mode, the MTA decoder 220 may be configured to receive MTA-compliant data and the main array 225 may be configured to receive a first quantity (e.g., sixteen) of data bits in a burst from the MTA decoder 220. If the data bits are requested by another device (or component of the memory device 200), the main array 225 may communicate the data bits (e.g., in a sixteen-bit burst) to the MTA encoder 230, which may encode the data bits using MTA coding before communicating the resulting MTA-encoded data bits (e.g., in an eighteen-bit burst) to the PAM encoder 235 for PAM modulation.

During a support mode, the receiver block 205 may be operated in the masking mode and the switching circuit 215 may be configured so that a second coupling (e.g., instead of the first coupling) is established between the receiver block 205 and the MTA decoder 220. Also, the MTA decoder 220 may be disabled, meaning that the MTA decoding functionality of the MTA decoder 220 is disabled (e.g., by-passed), and the MTA encoder 230 may be enabled or disabled (where disabled refers to the MTA functionality or circuitry of the MTA encoder 230). The MTA decoder 220 may disabled so that data is communicated to the main array 225 without undergoing MTA decoding.

In a support mode, the receiver block 205 may receive PAM-modulated and MTA-encoded data symbols representing support mode data sequences and may generate pairs of data bits (e.g., an LSB and an MSB) for each data symbol. For example, the receiver block 205 may receive a burst of data symbols (e.g., nine data symbols, one per receiver 245) in parallel and generate an LSB/MSB pair for each data symbol. However, the LSB may be fixed to a logic one (or other value) because the receiver block 205 is operated in the masking mode during the support mode. The received data symbols may include a set of data symbols (e.g., eight data symbols denoted DQ0 through DQ7) encoded with MTA coding and an additional MTA data symbol (denoted DQX) that results from the MTA encoding. Thus, in one example, the receiver block 205 may generate eighteen bits (e.g., nine LSB/MSB pairs) from nine data symbols, but only the MSBs may convey meaningful information (because the LSBs are fixed). As noted, meaningful data may refer to data received from an enabled sub-receiver (and that therefore provides information about, or reflects characteristics of, that sub-receiver).

The disabled MTA decoder 220 may receive select LSB and MSB data from the receiver block 205 (as described with more detail in FIG. 3) and communicate the received LSM and MSB data to the main array 225 without performing decoding. For example, the MTA decoder 220 may receive sixteen data bits from the receiver block 205 and communicate the sixteen data bits to the main array 225 for storage. So, during the support mode, the MTA decoder 220 may be configured to receive MTA-non-compliant data and the main array 225 may be configured to receive the first quantity (e.g., sixteen) of data bits in a burst from the MTA decoder 220. If the data bits are requested by another device (or component of the memory device 200), the main array 225, MTA encoder 230, and PAM encoder 235 may operate as described with reference to the mission mode or as described with reference to FIG. 4.

Thus, the memory device 200 may operate in different operating modes and use the main arrays 225 to store support mode sequences in a support mode. In some examples, the memory device 200 may switch between different operating modes (e.g., the memory device may switch from the mission mode to an operating mode, or vice versa).

In some examples, the techniques described herein may be implemented with the MTA decoder 220, the MTA encoder 230, or both partially disabled (as opposed to fully disabled). For example, the MTA protection provided by the MTA encoder 230 may involve an MTA look-up-table (LUT) stage that prevents maximum transitions within a burst of data (e.g., a 4-symbol burst) and an inversion stage that prevents maximum transitions between sequential bursts. Put another way, the MTA encoder 230 may be configured to prevent or remove maximum transitions within a burst of data by applying the MTA-LUT and may further be configured to prevent or remove maximum transitions between sequential bursts data (e.g., 4-symbol bursts) by performing one or more inversions. The MTA decoding provided by the MTA decoder 220 may involve a LUT stage and an inversion stage (e.g., to restore the data to original form). In such a scenario, the techniques described herein may be implemented by disabling or by-passing the respective inversion stages at the MTA encoder 230, or the MTA decoder 220, or both, which may otherwise be responsible for issues that arise from using receiver masking with the main array 225. Disabling one stage (e.g., the inversion stage) or less than all of the stages of an MTA component (e.g., the MTA decoder 220 or the MTA encoder 230) may be referred to as "partially disabling" the MTA component whereas disabling all stages (e.g., both stages) may be referred to as "disabling" or "fully disabling" the MTA component.

The switching circuit 215 may include one or more switching components, such as transistors, multiplexors, and the like, among other components. In some examples, the main array 225 may be a DRAM array and the secondary array(s) 240 may be SRAM arrays configured to operate as first-in-first-out (FIFO) storage structures. In some examples, aspects of the operations of the memory device 200 may be controlled by logic, such as a logic circuit, which may be coupled with one or more of the components of the memory device 200. In some examples, the MTA decoder 220, the main array 225, the MTA encoder 230, and the PAM encoder 235 may be referred to collectively as the memory core or memory core logic.

Figure 3:
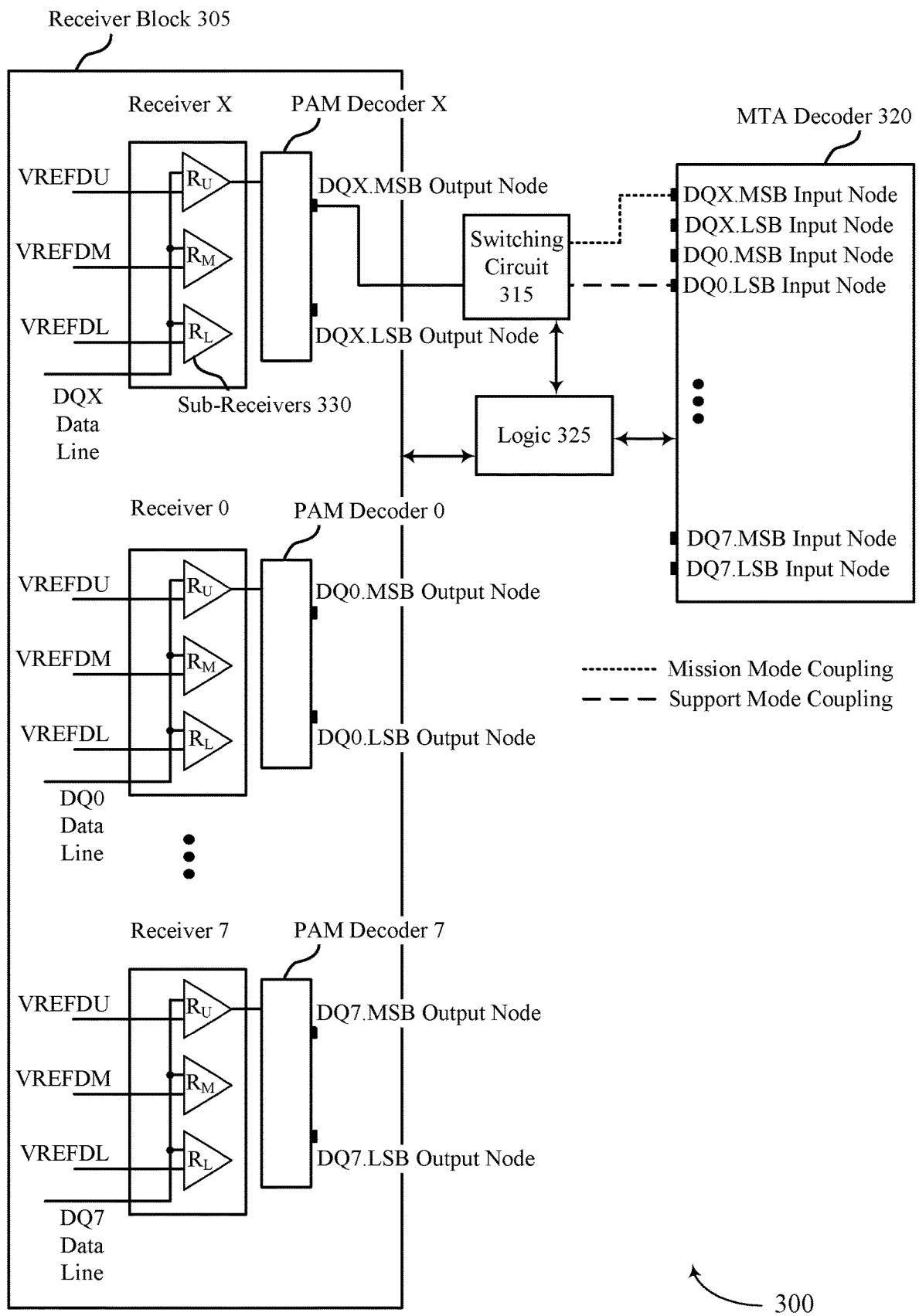
FIG. 3 illustrates an example of a memory device that supports masked training and analysis with a memory array in accordance with examples as disclosed herein.

FIG. 3 illustrates an example of a memory device 300 that supports masked training and analysis with a memory array in accordance with examples as disclosed herein. The memory device 300 may be an example of the memory device 110 as described with reference to FIG. 1 or a memory device 200 as described with reference to FIG. 2. The memory device 200 may include a receiver block 305, a switching circuit 315, and an MTA decoder 320, which may be examples of corresponding components described with reference to FIG. 2. Other components of the memory device 300 are omitted only for clarity. The memory device 300 may strategically operate the receiver block 305, the switching circuit 315, and the MTA decoder 320 so that a main memory array can be used to store support mode data sequences. Aspects of the operations of the receiver block 305, the switching circuit 315, and the MTA decoder 320 may be controlled by logic 325, which may be an example of a logic circuit, a processor, a local controller, or other type of control component.

The receiver block 305 may include a set of receivers (e.g., nine receivers), three of which are illustrated in FIG. 3. Receiver X (which may be referred to as an MTA receiver) may receive MTA symbols (DQX) and de-modulate the MTA symbols using PAM decoder X. Receiver 0 through Receiver 7 may receive data symbols (e.g., DQ0 through DQ7) and de-modulate the data symbols using respective PAM decoders (denoted PAM decoder 0 through PAM decoder 7). Depending on the mode in which the receiver block is configured, the PAM decoders may be coupled with one or more sub-receivers 330, which may also be referred to as receivers, receiver circuits, or other suitable terminology. In some examples, a sub-receiver 250 may be a comparator, sense amplifier, or other suitable circuit.

In the mission mode, the memory device 300 may operate the receiver block 305 in the non-masking mode and the input nodes of the enabled MTA decoder 320 may be coupled with corresponding output nodes of the receivers (e.g., so that data bits can be communicated from the receivers to the MTA decoder 320). For example, the MSB input node for DQX (denoted DQX.MSB input node) may be coupled with the MSB output node for DQX (denoted DQX.MSB output node), the LSB input node for DQX (denoted DQX.LSB input node) may be coupled with the LSB output node for DQX (denoted DQX.LSB output node), and so on and so forth. Generally, the connections between the input nodes of the MTA decoder 320 and the output nodes of the receivers may be hard-wired or otherwise fixed. However, the connection (e.g., conductive path) between the DQ0.LSB input node and the DQ0.LSB output node may be dynamically established by the switching circuit 315. And in some examples, the connections between the DQX output nodes and the DQX input nodes may be dynamically established (e.g., via respective switching components).

So, in the mission mode, the MTA decoder 320 may receive a burst of eighteen data bits (two per receiver) from the receiver block 305. As noted, the MTA decoder 320 may be enabled in the mission mode so that MTA decoding is performed on the eighteen data bits received from the receiver block 305.

During a support mode, the memory device 300 may operate the receiver block 305 in the masking mode and the input nodes of the disabled (or partially disabled) MTA decoder 320 may be coupled with corresponding output nodes of the receivers, with the exception of the DQ0.LSB input node (and possibly the DQX.MSB input node and the DQX.LSB input node). Rather than couple the DX0.LSB input node with the DQ0.LSB output node (which outputs meaningless LSBs during the support mode), the memory device 300 may couple the DQ0.LSB input node with the DQX.MSB output node, which outputs MSBs that provide meaningful training/analysis information for receiver X during the support mode. So, in the support mode, the DQ0.LSB input node may be coupled with the DQX.MSB output node (to ensure that meaningful MSBs for receiver X are communicated to the main array) and isolated from the DQ0.LSB output node (to prevent interference from LSBs from receiver 0). Although described with reference to the DQ0.LSB input node, any LSB input node other than the DQX.LSB input node may be coupled with the DQX.MSB output node.

Rather than couple the DQX.MSB input node (which may have a disabled data path in some examples) with the DQX.MSB output node, the memory device 300 may isolate the DQX.MSB input node from the DQX.MSB output node. Rather than couple the DQX.LSB input node (which may have a disabled data path) with the DQX.LSB output node, the memory device 300 may isolate the DQX.LSB input node from the DQX.LSB output node. Additionally or alternatively, the DQX input nodes may be fixed to a value (e.g., a logic 1).

Thus, in a support mode, the MTA decoder 320 may receive a burst of sixteen data bits (nine of which may be MSBs that provide meaningful training/analysis information for characterizing the enabled sub-receivers) from the receiver block 305. As noted, the MTA decoder 320 may be disabled in the support mode so that MTA decoding is not performed on the data bits before the data bits are communicated to the main memory array. Alternatively, the MTA decoder 320 may be partially disabled in the support mode. For example, the MTA-LUT stage of the MTA decoder 320 may be enabled, but the inversion stage may be disabled (e.g., by-passed, otherwise deactivated or avoided).

Figure 4:
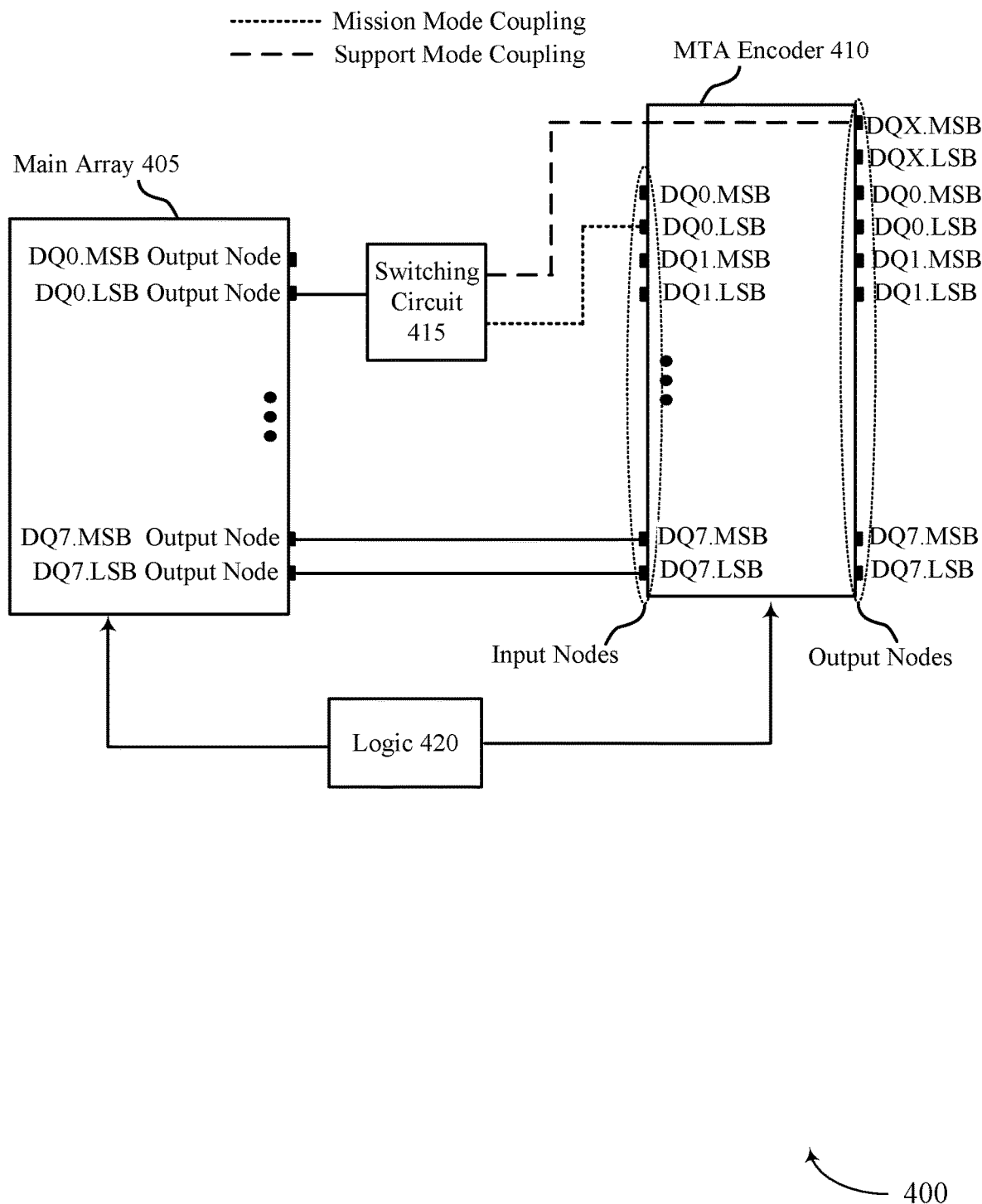
FIG. 4 illustrates an example of a memory device that supports masked training and analysis with a memory array in accordance with examples as disclosed herein.

FIG. 4 illustrates an example of a memory device 400 that supports masked training and analysis with a memory array in accordance with examples as disclosed herein. The memory device 400 may be an example of the memory device 110 as described with reference to FIG. 1, a memory device 200 as described with reference to FIG. 2, or a memory device 300 as described with reference to FIG. 3. The memory device 400 may include a main array 405 and an MTA encoder 410, which may be examples of corresponding components described with reference to FIG. 2. The memory device 400 may also include a switching circuit 415. Other components of the memory device 400 are omitted for clarity. The memory device 400 may strategically operate the MTA encoder 410 and the switching circuit 415 to accommodate support mode data sequences from the main array 405.

Aspects of the operations of the main array 405, the MTA encoder 410, the switching circuit 415 may be controlled by logic 420, which may be an example of a logic circuit, a processor, a local controller, or other type of control component.

In the mission mode, the MTA encoder 410 may be enabled and the input nodes of the MTA encoder 410 may be coupled with corresponding respective output nodes of the main array 405. For example, the input node for the MSB of DQ0 (denoted DQ0.MSB input node) may be coupled with the respective output node for the MSB of DQ0 (denoted DQ0.MSB output node), the input node for the LSB of DQ0 (denoted DQ0.LSB input node) may be coupled with the respective output node for the LSB of DQ0 (denoted DQ0.LSB output node), and so on and so forth. So, in the mission mode, the DQ0.LSB output node of the main array 405 may be coupled (e.g., via the switching circuit 415) with the DQ0.LSB input node of the MTA encoder 410. The MTA encoder 410 may encode the received data bits using MTA coding and communicate the resulting MTA-encoded data bits to a PAM encoder for PAM modulation. For example, the MTA encoder 410 may generate MTA-encoded LSBs and MSBs on the output nodes of the MTA encoder 410, which may be coupled with the PAM encoder.

In some examples, the MTA encoder 410 may be disabled during a support mode (e.g., the MTA encoding functionality or circuitry of the MTA encoder 410 may be disabled or by-passed). If the MTA encoder 410 is disabled, the memory device 400 may couple the inputs of the MTA encoder 410 similar to the mission mode. However, the DQX.MSB output node and the DQX.LSB output node may each be fixed high (e.g., to a logic 1). Thus, the MTA encoder 410 may communicate the data bits for DQ0 through DQ7— along with the fixed DQX bits—to a PAM decoder for PAM modulation. Because the MTA encoder 410 is disabled, the MTA encoder 410 may communicate the data bits to the PAM encoder without performing MTA encoding.

In some examples, the MTA encoder 410 may be enabled during a support mode. If the MTA encoder 410 is enabled, the memory device 400 may couple the inputs of the MTA encoder 410 similar to the mission mode. However, the memory device 400 may couple the DQX.MSB output node of the MTA encoder with the DQ0.LSB output node of the main array 405 (e.g., so that the DQX.MSB output node receives the DQX MSB, which was circulated through the main array 405 in the place of the DQ0 LSB). The DQX.MSB output node of the MTA encoder may be coupled with the DQ0.LSB output node of the main array 405 via the switching circuit 415. Further, the memory device 400 may fix the LSB output nodes of the MTA encoder 410 to be logic is (e.g., the memory device 400 may couple the LSB output nodes to high voltage sources). Because the MTA encoder is enabled, the MTA encoder 410 may communicate the data bits to a PAM encoder after performing MTA encoding.

In some examples, the MTA encoder 410 may be partially disabled during the support mode, as opposed to being fully disabled (or enabled). For example, the MTA-LUT stage at the MTA encoder 410 may be enabled, but the inversion stage may be disabled (e.g., by-passed or otherwise avoided). In such an example, the connections between the output nodes of the main array 405 and the input nodes of the MTA encoder 410 may be the same or similar to the connections described with reference to the example in which the MTA encoder is fully disabled (e.g., may have both the MTA-LUT stage and the inversion stage disabled).

Figure 5:
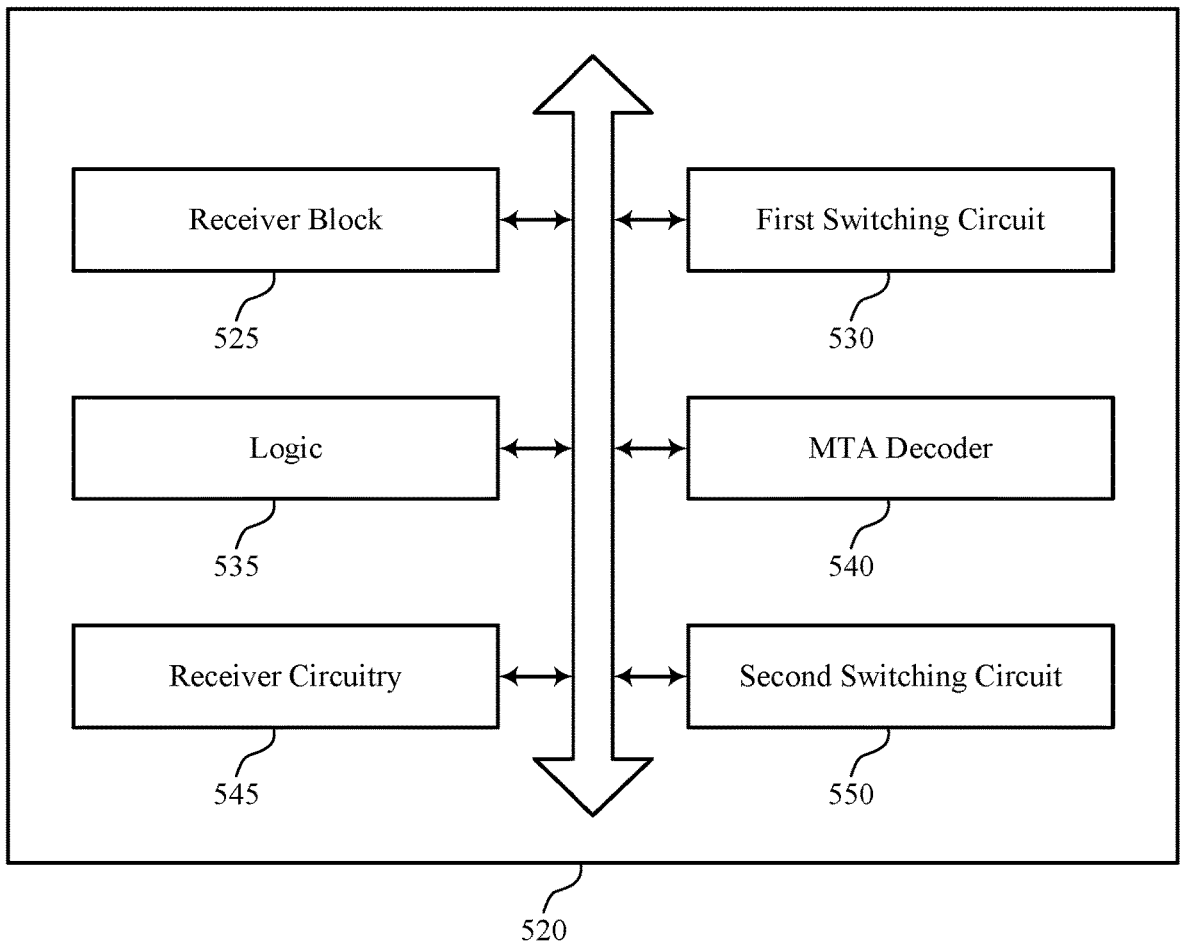
FIG. 5 shows a block diagram of a memory device that supports masked training and analysis with a memory array in accordance with examples as disclosed herein.

FIG. 5 shows a block diagram 500 of a memory device 520 that supports masked training and analysis with a memory array in accordance with examples as disclosed herein. The memory device 520 may be an example of aspects of a memory device as described with reference to FIGS. 1 through 4. The memory device 520, or various components thereof, may be an example of means for performing various aspects of masked training and analysis with a memory array as described herein. For example, the memory device 520 may include a receiver block 525, a first switching circuit 530, a logic 535, an MTA decoder 540, a receiver circuitry 545, a second switching circuit 550, or any combination thereof. Each of these components may communicate, directly or indirectly, with one another (e.g., via one or more buses).

The receiver block 525 may be configured as or otherwise support a means for generating, at a first output node of a first PAM decoder (e.g., PAM decoder X) coupled with an MTA decoder of a memory device, a most significant bit for a first data symbol (e.g., DQX) of a data set modulated according to PAM modulation and encoded using MTA coding. In some examples, the receiver block 525 may be configured as or otherwise support a means for generating, at a second output node of a second PAM decoder (e.g., PAM decoder 0) coupled with the MTA decoder, a least significant bit for a second data symbol (e.g., DQ0) of the data set. The first switching circuit 530 may be configured as or otherwise support a means for coupling, during operation of the memory device in a first mode (e.g., a support mode) and using a switching circuit (e.g., switching circuit 315), an input node of the MTA decoder (e.g., DQ0.LSB) with the first output node (e.g., DQX.MSB output node) of the first PAM decoder. In some examples, the first switching circuit 530 may be configured as or otherwise support a means for coupling, during operation of the memory device in a second mode (e.g., the mission mode) and using the switching circuit, the input node of the MTA decoder with the second output node (e.g., DQ0.LSB output node) of the second PAM decoder.

In some examples, the MTA decoder 540 may be configured as or otherwise support a means for communicating, during operation of the memory device in the first mode, the most significant bit of the first data symbol from the MTA decoder to a memory array of the memory device without performing MTA decoding.

In some examples, the logic 535 may be configured as or otherwise support a means for disabling the MTA decoder during operation of the memory device in the first mode, where disabling the MTA decoder disables an MTA decoding functionality of the MTA decoder. In some examples, the logic 535 may be configured as or otherwise support a means for disabling an inversion stage of the MTA decoder during operation of the memory device in the first mode.

In some examples, the MTA decoder 540 may be configured as or otherwise support a means for receiving, at the MTA decoder during operation of the memory device in the first mode, a most significant bit of the second data symbol (e.g., DQ0 MSB) from the second PAM decoder. In some examples, the MTA decoder 540 may be configured as or otherwise support a means for communicating the most significant bit of the second data symbol to the memory array.

In some examples, the receiver circuitry 545 may be configured as or otherwise support a means for coupling, during operation of the memory device in the first mode, the first PAM decoder (e.g., PAM decoder X) with a single receiver (e.g., sub-receiver Ru) in a first set of receivers for the first PAM decoder. In some examples, the receiver circuitry 545 may be configured as or otherwise support a means for coupling, during operation of the memory device in the first mode, the second PAM decoder (e.g., PAM decoder 0) with a single receiver (e.g., sub-receiver Ru) in a second set of receivers for the second PAM decoder.

In some examples, the receiver circuitry 545 may be configured as or otherwise support a means for coupling, during operation of the memory device in the second mode, the first PAM decoder (e.g., PAM decoder X) with each receiver (e.g., sub-receiver Ru, sub-receiver $R_M$, and sub-receiver $R_L$) in the first set of receivers. In some examples, the receiver circuitry 545 may be configured as or otherwise support a means for coupling, during operation of the memory device in the second mode, the second PAM decoder (e.g., PAM decoder 0) with each receiver (e.g., sub-receiver Ru, sub-receiver $R_M$, and sub-receiver $R_L$) in the second set of receivers.

In some examples, the data set is from a memory array (e.g., main array 225) coupled with the MTA decoder, and the logic 535 may be configured as or otherwise support a means for enabling, during operation of the memory device in the first mode, an MTA encoder coupled with the memory array.

In some examples, the data set is from a memory array (e.g., main array 225) coupled with the MTA decoder, and the logic 535 may be configured as or otherwise support a means for disabling, during operation of the memory device in the first mode, an MTA encoder coupled with the memory array. In some examples, the data set is from a memory array coupled with the MTA decoder, and the logic 535 may be configured as or otherwise support a means for enabling, during operation of the memory device in the second mode, the MTA encoder. In some examples, disabling the MTA encoder includes disabling an inversion stage of the MTA encoder and enabling the MTA encoder includes enabling the inversion stage.

In some examples, the second switching circuit 550 may be configured as or otherwise support a means for coupling, using a second switching circuit (e.g., switching circuit 415) and during operation of the memory device in the first mode, an output node of the MTA encoder (e.g., DQX.MSB output node) with an output node (e.g., DQ0.LSB output node) of the memory array (e.g., main array 405). In some examples, the second switching circuit 550 may be configured as or otherwise support a means for coupling, using the second switching circuit and during operation of the memory device in the second mode, an input node of the MTA encoder (e.g., DQ0.LSB input node) with the output node of the memory array.

The logic 535 may be configured as or otherwise support a means for operating a memory device in a first mode (e.g., a support mode) in which an MTA decoder for a memory array of the memory device is disabled. In some examples, the first switching circuit 530 may be configured as or otherwise support a means for coupling, using a switching circuit during the first mode, an input node of the MTA decoder (e.g., DQ0.LSB input node) with a first output node of a first PAM decoder (e.g., DQX.MSB output node), the first output node for outputting a most significant bit for a first data symbol of a data set modulated according to PAM modulation and encoded using MTA coding. In some examples, the logic 535 may be configured as or otherwise support a means for operating the memory device in a second mode in which the MTA decoder for the memory array is enabled. In some examples, the first switching circuit 530 may be configured as or otherwise support a means for coupling, using the switching circuit during the second mode, the input node of the MTA decoder with a second output node of a second PAM decoder (e.g., DQ0.LSB output node), the second output node for outputting a least significant bit for a second data symbol of the data set.

In some examples, the receiver circuitry 545 may be configured as or otherwise support a means for isolating, during the first mode, the first PAM decoder from all but one receiver in a first set of receivers for the first PAM decoder, where each receiver in the first set of receivers is coupled with the first PAM decoder during the second mode. In some examples, the receiver circuitry 545 may be configured as or otherwise support a means for isolating, during the second mode, the second PAM decoder from all but one receiver in a second set of receivers for the second PAM decoder, where each receiver in the second set of receivers is coupled with the second PAM decoder during the second mode.

In some examples, the first switching circuit 530 may be configured as or otherwise support a means for isolating the second output node (e.g., DQ0.LSB output node) of the second PAM decoder from the input node (e.g., DQX.MSB input node) of the MTA decoder during the first mode.

In some examples, the MTA decoder 540 may be configured as or otherwise support a means for receiving, at the MTA decoder during the first mode, a most significant bit of the second data symbol (e.g., DQ0 MSB) from the second PAM decoder. In some examples, the MTA decoder 540 may be configured as or otherwise support a means for communicating the most significant bit of the first data symbol (e.g., DQX MSB) and the most significant bit of the second data symbol (e.g., DQ0 MSB) to the memory array without performing MTA decoding.

Figure 6:
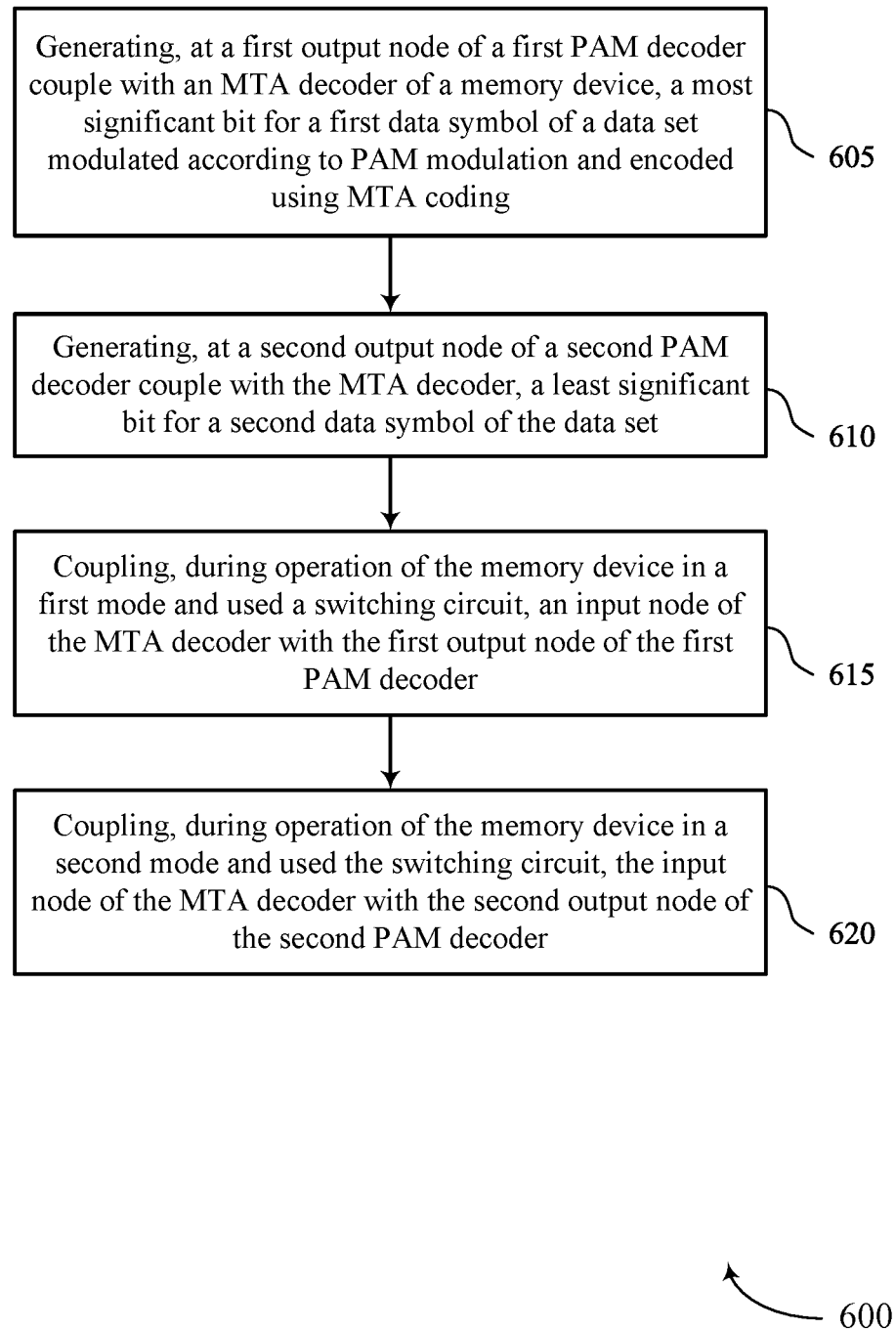
FIGS. 6 and 7 show flowcharts illustrating a method or methods that support masked training and analysis with a memory array in accordance with examples as disclosed herein.

FIG. 6 shows a flowchart illustrating a method 600 that supports masked training and analysis with a memory array in accordance with examples as disclosed herein. The operations of method 600 may be implemented by a memory device or its components as described herein. For example, the operations of method 600 may be performed by a memory device as described with reference to FIGS. 1 through 5. In some examples, a memory device may execute a set of instructions to control the functional elements of the device to perform the described functions. Additionally or alternatively, the memory device may perform aspects of the described functions using special-purpose hardware.

At 605, the method may include generating, at a first output node of a first PAM decoder coupled with an MTA decoder of a memory device, a most significant bit for a first data symbol of a data set modulated according to PAM modulation and encoded using MTA coding. The operations of 605 may be performed in accordance with examples as disclosed herein. In some examples, aspects of the operations of 605 may be performed by a receiver block 525 as described with reference to FIG. 5.

At 610, the method may include generating, at a second output node of a second PAM decoder coupled with the MTA decoder, a least significant bit for a second data symbol of the data set. The operations of 610 may be performed in accordance with examples as disclosed herein. In some examples, aspects of the operations of 610 may be performed by a receiver block 525 as described with reference to FIG. 5.

At 615, the method may include coupling, during operation of the memory device in a first mode and using a switching circuit, an input node of the MTA decoder with the first output node of the first PAM decoder. The operations of 615 may be performed in accordance with examples as disclosed herein. In some examples, aspects of the operations of 615 may be performed by a first switching circuit 530 as described with reference to FIG. 5.

At 620, the method may include coupling, during operation of the memory device in a second mode and using the switching circuit, the input node of the MTA decoder with the second output node of the second PAM decoder. The operations of 620 may be performed in accordance with examples as disclosed herein. In some examples, aspects of the operations of 620 may be performed by a first switching circuit 530 as described with reference to FIG. 5.

In some examples, an apparatus as described herein may perform a method or methods, such as the method 600. The apparatus may include, features, circuitry, logic, means, or instructions (e.g., a non-transitory computer-readable medium storing instructions executable by a processor) for generating, at a first output node of a first PAM decoder coupled with an MTA decoder of a memory device, a most significant bit for a first data symbol of a data set modulated according to PAM modulation and encoded using MTA coding, generating, at a second output node of a second PAM decoder coupled with the MTA decoder, a least significant bit for a second data symbol of the data set, coupling, during operation of the memory device in a first mode and using a switching circuit, an input node of the MTA decoder with the first output node of the first PAM decoder, and coupling, during operation of the memory device in a second mode and using the switching circuit, the input node of the MTA decoder with the second output node of the second PAM decoder.

In some examples of the method 600 and the apparatus described herein, communicating, during operation of the memory device in the first mode, the most significant bit of the first data symbol from the MTA decoder to a memory array of the memory device without performing MTA decoding.

Some examples of the method 600 and the apparatus described herein may further include operations, features, circuitry, logic, means, or instructions for disabling the MTA decoder during operation of the memory device in the first mode, where disabling the MTA decoder disables an MTA decoding functionality of the MTA decoder or disables an inversion stage of the MTA decoder. In some examples of the method 600 and the apparatus described herein may further include operations, features, circuitry, logic, means, or instructions for disabling an inversion stage of the MTA decoder during operation of the memory device in the first mode.

Some examples of the method 600 and the apparatus described herein may further include operations, features, circuitry, logic, means, or instructions for receiving, at the MTA decoder during operation of the memory device in the first mode, a most significant bit of the second data symbol from the second PAM decoder and communicating the most significant bit of the second data symbol to the memory array.

In some examples of the method 600 and the apparatus described herein, coupling, during operation of the memory device in the first mode, the first PAM decoder with a single receiver in a first set of receivers for the first PAM decoder and coupling, during operation of the memory device in the first mode, the second PAM decoder with a single receiver in a second set of receivers for the second PAM decoder.

In some examples of the method 600 and the apparatus described herein, coupling, during operation of the memory device in the second mode, the first PAM decoder with each receiver in the first set of receivers and coupling, during operation of the memory device in the second mode, the second PAM decoder with each receiver the second set of receivers.

In some examples of the method 600 and the apparatus described herein, the data set may be from a memory array coupled with the MTA decoder and the method, apparatuses, and non-transitory computer-readable medium may include further operations, features, circuitry, logic, means, or instructions for enabling, during operation of the memory device in the first mode, an MTA encoder coupled with the memory array.

In some examples of the method 600 and the apparatus described herein, the data set may be from a memory array coupled with the MTA decoder and the method, apparatuses, and non-transitory computer-readable medium may include further operations, features, circuitry, logic, means, or instructions for disabling, during operation of the memory device in the first mode, an MTA encoder coupled with the memory array and enabling, during operation of the memory device in the second mode, the MTA encoder. In some examples of the method 600 and the apparatus described herein, disabling the MTA encoder includes disabling an inversion stage of the MTA encoder and enabling the MTA encoder includes enabling the inversion stage.

In some examples of the method 600 and the apparatus described herein, coupling, using a second switching circuit and during operation of the memory device in the first mode, an output node of the MTA encoder (e.g., DQX.MSB output node) with an output node of the memory array and coupling, using the second switching circuit and during operation of the memory device in the second mode, an input node of the MTA encoder (e.g., DQ0.LSB input node) with the output node of the memory array.

Figure 7:
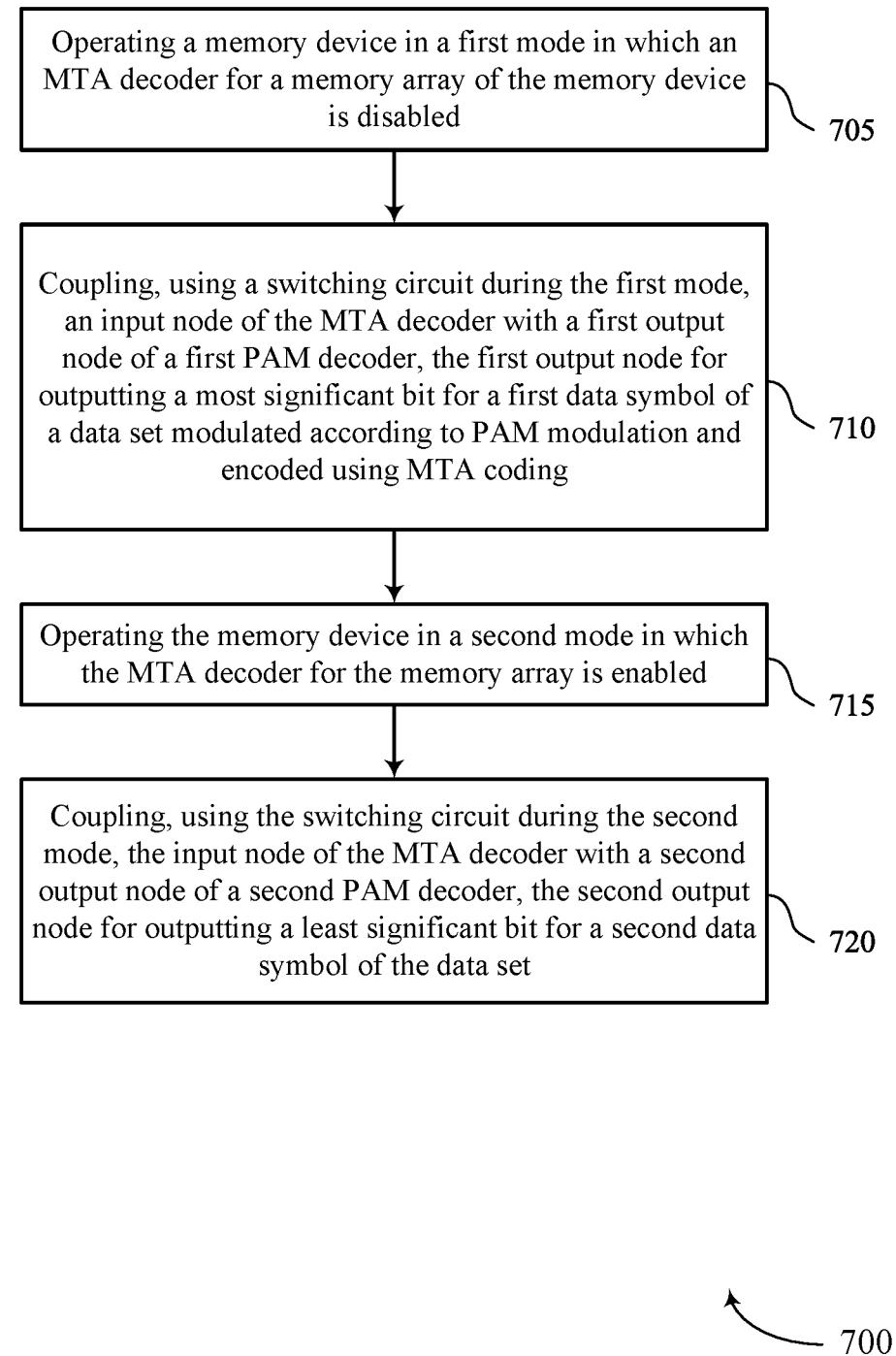

FIG. 7 shows a flowchart illustrating a method 700 that supports masked training and analysis with a memory array in accordance with examples as disclosed herein. The operations of method 700 may be implemented by a memory device or its components as described herein. For example, the operations of method 700 may be performed by a memory device as described with reference to FIGS. 1 through 5. In some examples, a memory device may execute a set of instructions to control the functional elements of the device to perform the described functions. Additionally or alternatively, the memory device may perform aspects of the described functions using special-purpose hardware.

At 705, the method may include operating a memory device in a first mode in which an MTA decoder for a memory array of the memory device is disabled. The operations of 705 may be performed in accordance with examples as disclosed herein. In some examples, aspects of the operations of 705 may be performed by a logic 535 as described with reference to FIG. 5.

At 710, the method may include coupling, using a switching circuit during the first mode, an input node of the MTA decoder with a first output node of a first PAM decoder, the first output node for outputting a most significant bit for a first data symbol of a data set modulated according to PAM modulation and encoded using MTA coding. The operations of 710 may be performed in accordance with examples as disclosed herein. In some examples, aspects of the operations of 710 may be performed by a first switching circuit 530 as described with reference to FIG. 5.

At 715, the method may include operating the memory device in a second mode in which the MTA decoder for the memory array is enabled. The operations of 715 may be performed in accordance with examples as disclosed herein. In some examples, aspects of the operations of 715 may be performed by a logic 535 as described with reference to FIG. 5.

At 720, the method may include coupling, using the switching circuit during the second mode, the input node of the MTA decoder with a second output node of a second PAM decoder, the second output node for outputting a least significant bit for a second data symbol of the data set. The operations of 720 may be performed in accordance with examples as disclosed herein. In some examples, aspects of the operations of 720 may be performed by a first switching circuit 530 as described with reference to FIG. 5.

In some examples, an apparatus as described herein may perform a method or methods, such as the method 700. The apparatus may include, features, circuitry, logic, means, or instructions (e.g., a non-transitory computer-readable medium storing instructions executable by a processor) for operating a memory device in a first mode in which an MTA decoder for a memory array of the memory device is disabled, coupling, using a switching circuit during the first mode, an input node of the MTA decoder with a first output node of a first PAM decoder, the first output node for outputting a most significant bit for a first data symbol of a data set modulated according to PAM modulation and encoded using MTA coding, operating the memory device in a second mode in which the MTA decoder for the memory array is enabled, and coupling, using the switching circuit during the second mode, the input node of the MTA decoder with a second output node of a second PAM decoder, the second output node for outputting a least significant bit for a second data symbol of the data set.

In some examples of the method 700 and the apparatus described herein, isolating, during the first mode, the first PAM decoder from all but one receiver in a first set of receivers for the first PAM decoder, where each receiver in the first set of receivers may be coupled with the first PAM decoder during the second mode and isolating, during the second mode, the second PAM decoder from all but one receiver in a second set of receivers for the second PAM decoder, where each receiver in the second set of receivers may be coupled with the second PAM decoder during the second mode.

Some examples of the method 700 and the apparatus described herein may further include operations, features, circuitry, logic, means, or instructions for isolating the second output node of the second PAM decoder from the input node of the MTA decoder during the first mode.

Some examples of the method 700 and the apparatus described herein may further include operations, features, circuitry, logic, means, or instructions for receiving, at the MTA decoder during the first mode, a most significant bit of the second data symbol from the second PAM decoder and communicating the most significant bit of the first data symbol and the most significant bit of the second data symbol to the memory array without performing MTA decoding.

It should be noted that the methods described herein describe possible implementations, and that the operations and the steps may be rearranged or otherwise modified and that other implementations are possible. Further, portions from two or more of the methods may be combined.

An apparatus is described. The apparatus may include a first pulse amplitude modulation (PAM) decoder coupled with a maximum transition avoidance (MTA) decoder of a memory device, the first PAM decoder including a first output node configured to output a most significant bit for a first data symbol of a data set modulated according to PAM modulation and encoded using MTA coding, a second PAM decoder coupled with the MTA decoder, the second PAM decoder including a second output node configured to output a least significant bit for a second data symbol of the data set, and a switching circuit configurable to couple, in a first mode of the memory device, an input node of the MTA decoder with the first output node of the first PAM decoder, and configurable to couple, in a second mode of the memory device, the input node of the MTA decoder with the second output node of the second PAM decoder.

In some examples, the apparatus may include logic configured to disable the MTA decoder in the first mode and configured to enable the MTA decoder in the second mode.

In some examples of the apparatus, the MTA decoder may be configured, when disabled, to communicate bits from the first and second PAM decoders to a memory array of the memory device without performing MTA decoding.

In some examples, the apparatus may include a memory array coupled with the MTA decoder, where the memory array may be configured to store the data set and an MTA encoder coupled with the memory array and configured to be enabled in the first and second modes.

In some examples, the apparatus may include a memory array coupled with the MTA decoder, where the memory array may be configured to store the data set and an MTA encoder coupled with the memory array configured to be disabled in the first mode and enabled in the second mode.

In some examples, the apparatus may include a second switching circuit configurable to couple, in the first mode, an output node of the MTA encoder with an output node of the memory array and couple, in the second mode, an input node of the MTA encoder with the output node of the memory array.

In some examples of the apparatus, the first output node may be coupled, in the second mode, with a second input node of the MTA decoder and the second output node may be isolated, in the first mode, from the input node.

In some examples, the apparatus may include a third output node of the first PAM decoder that may be configured to output a least significant bit for the first data symbol, where the third output node may be coupled, in the first and second modes, with a second input node of the MTA decoder and a fourth output node, of the second PAM decoder, that may be configured to output a most significant bit for the second data symbol, where the fourth output node may be coupled, in the first and second modes, with a third input node of the MTA decoder.

In some examples, the apparatus may include a first set of receivers for the first PAM decoder, where a single receiver of the first set of receivers may be configured to be coupled with the first PAM decoder in the first mode and each receiver in the first set of receivers may be configured to be coupled with the first PAM decoder in the second mode. In some examples, the apparatus may include a second set of receivers for the second PAM decoder, where a single receiver of the second set of receivers may be configured to be coupled with the second PAM decoder in the first mode and each receiver in the second set of receivers may be configured to be coupled with the second PAM decoder in the second mode.

In some examples, the apparatus may include a first data line coupled with the first PAM decoder, where the first PAM decoder may be configured to receive the first data symbol over the first data line and a second data line coupled with the second PAM decoder, where the second PAM decoder may be configured to receive the second data symbol over the second data line concurrent with the first data symbol.

In some examples of the apparatus, the first mode includes a training mode or an analysis mode and the second mode includes a mode other than a training mode or an analysis mode.

Another apparatus is described. The apparatus may include an MTA decoder coupled with a memory array, a first PAM decoder coupled with the MTA decoder and including a first output node configured to output a most significant bit for a first data symbol of a data set, a second PAM decoder coupled with the MTA decoder and including a second output node configured to output a least significant bit for a second data symbol of the data set, and logic operable to cause a switching circuit to couple, during a first mode of the apparatus, an input node of the MTA decoder with the first output node of the first PAM decoder and couple, during a second mode of the apparatus, the input node of the MTA decoder with the second output node of the second PAM decoder.

In some examples of the apparatus, the MTA decoder may be configured to communicate, during the first mode, the most significant bit of the first data symbol to the memory array without performing MTA decoding.

In some examples, the apparatus may be configured to disable the MTA decoder during the first mode, where disabling the MTA decoder disables an MTA decoding functionality of the MTA decoder. In some examples, the apparatus may be configured to disable an inversion stage of the MTA decoder during operation of the memory device in the first mode Another apparatus is described. The apparatus may include an MTA decoder coupled with a memory array, a first PAM decoder coupled with the MTA decoder, a second PAM decoder coupled with the MTA decoder, logic operable to cause the apparatus to, and operate in a first mode in which the MTA decoder is disabled couple, during the first mode, an input node of the MTA decoder with a first output node of the first PAM decoder that is configured to output a most significant bit for a first data symbol of a data set modulated according to PAM modulation and encoded using MTA coding, operate the apparatus in a second mode in which the MTA decoder is enabled, and couple, during the second mode, the input node of the MTA decoder with a second output node of the second PAM decoder that is configured to output a least significant bit for a second data symbol of the data set.

In some examples, the apparatus may include a switching circuit coupled with the MTA decoder, where the logic may be operable to cause the switching circuit to couple the input node of the MTA decoder with the first output node or the second output node based at least in part on an operating mode of the apparatus.

In some examples, the apparatus may include a first set of receivers for the first PAM decoder and a second set of receivers for the second PAM decoder, where the logic may be operable to.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

As used herein, the term "substantially" means that the modified characteristic (e.g., a verb or adjective modified by the term substantially) need not be absolute but is close enough to achieve the advantages of the characteristic. As used herein, the term "concurrent" means occurring at substantially the same time or at least partially overlapping in time.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
a first pulse amplitude modulation (PAM) decoder coupled with a maximum transition avoidance (MTA) decoder of a memory device, the first PAM decoder comprising a first output node configured to output a most significant bit for a first data symbol of a data set modulated according to PAM modulation and encoded using MTA coding;
a second PAM decoder coupled with the MTA decoder, the second PAM decoder comprising a second output node configured to output a least significant bit for a second data symbol of the data set; and
a switching circuit configurable to couple, in a first mode of the memory device, an input node of the MTA decoder with the first output node of the first PAM decoder, and configurable to couple, in a second mode of the memory device, the input node of the MTA decoder with the second output node of the second PAM decoder.

2. The apparatus of claim 1, further comprising:
logic configured to disable the MTA decoder in the first mode and configured to enable the MTA decoder in the second mode.

3. The apparatus of claim 2, wherein the MTA decoder is configured, when disabled, to communicate bits from the first and second PAM decoders to a memory array of the memory device without performing MTA decoding.

4. The apparatus of claim 1, further comprising:
a memory array coupled with the MTA decoder, wherein the memory array is configured to store the data set; and
an MTA encoder coupled with the memory array and configured to be enabled in the first and second modes.

5. The apparatus of claim 1, further comprising:
a memory array coupled with the MTA decoder, wherein the memory array is configured to store the data set; and
an MTA encoder coupled with the memory array configured to be disabled in the first mode and enabled in the second mode.

6. The apparatus of claim 5, further comprising:
a second switching circuit configurable to couple, in the first mode, an output node of the MTA encoder with an output node of the memory array and couple, in the second mode, an input node of the MTA encoder with the output node of the memory array.

7. The apparatus of claim 1, wherein the first output node is coupled, in the second mode, with a second input node of the MTA decoder and the second output node is isolated, in the first mode, from the input node.

8. The apparatus of claim 1, further comprising:
a third output node of the first PAM decoder that is configured to output a least significant bit for the first data symbol, wherein the third output node is coupled, in the first and second modes, with a second input node of the MTA decoder; and
a fourth output node, of the second PAM decoder, that is configured to output a most significant bit for the second data symbol, wherein the fourth output node is coupled, in the first and second modes, with a third input node of the MTA decoder.

9. The apparatus of claim 1, further comprising:
a first set of receivers for the first PAM decoder, wherein a single receiver of the first set of receivers is configured to be coupled with the first PAM decoder in the first mode and each receiver in the first set of receivers is configured to be coupled with the first PAM decoder in the second mode; and
a second set of receivers for the second PAM decoder, wherein a single receiver of the second set of receivers is configured to be coupled with the second PAM decoder in the first mode and each receiver in the second set of receivers is configured to be coupled with the second PAM decoder in the second mode.

10. A method, comprising:
generating, at a first output node of a first pulse amplitude modulation (PAM) decoder coupled with a maximum transition avoidance (MTA) decoder of a memory device, a most significant bit for a first data symbol of a data set modulated according to PAM modulation and encoded using MTA coding;
generating, at a second output node of a second PAM decoder coupled with the MTA decoder, a least significant bit for a second data symbol of the data set;
coupling, during operation of the memory device in a first mode and using a switching circuit, an input node of the MTA decoder with the first output node of the first PAM decoder; and
coupling, during operation of the memory device in a second mode and using the switching circuit, the input node of the MTA decoder with the second output node of the second PAM decoder.

11. The method of claim 10, further comprising:
communicating, during operation of the memory device in the first mode, the most significant bit of the first data symbol from the MTA decoder to a memory array of the memory device without performing MTA decoding.

12. The method of claim 11, further comprising:
disabling the MTA decoder during operation of the memory device in the first mode, wherein disabling the MTA decoder disables an MTA decoding functionality of the MTA decoder.

13. The method of claim 11, further comprising:
disabling an inversion stage of the MTA decoder during operation of the memory device in the first mode.

14. The method of claim 11, further comprising:
receiving, at the MTA decoder during operation of the memory device in the first mode, a most significant bit of the second data symbol from the second PAM decoder; and
communicating the most significant bit of the second data symbol to the memory array.

15. The method of claim 10, further comprising:
coupling, during operation of the memory device in the first mode, the first PAM decoder with a single receiver in a first set of receivers for the first PAM decoder; and
coupling, during operation of the memory device in the first mode, the second PAM decoder with a single receiver in a second set of receivers for the second PAM decoder.

16. The method of claim 15, further comprising:
coupling, during operation of the memory device in the second mode, the first PAM decoder with each receiver in the first set of receivers; and
coupling, during operation of the memory device in the second mode, the second PAM decoder with each receiver the second set of receivers.

17. The method of claim 10, wherein the data set is from a memory array coupled with the MTA decoder, the method further comprising:

enabling, during operation of the memory device in the first mode, an MTA encoder coupled with the memory array.

18. The method of claim 10, wherein the data set is from a memory array coupled with the MTA decoder, the method further comprising:
disabling, during operation of the memory device in the first mode, an MTA encoder coupled with the memory array, and
enabling, during operation of the memory device in the second mode, the MTA encoder.

19. The method of claim 18, wherein disabling the MTA encoder comprises disabling an inversion stage of the MTA encoder and enabling the MTA encoder comprises enabling the inversion stage.

20. The method of claim 18, further comprising:
coupling, using a second switching circuit and during operation of the memory device in the first mode, an output node of the MTA encoder with an output node of the memory array; and
coupling, using the second switching circuit and during operation of the memory device in the second mode, an input node of the MTA encoder with the output node of the memory array.

21. A method, comprising:
operating a memory device in a first mode in which a maximum transition avoidance (MTA) decoder for a memory array of the memory device is disabled;
coupling, using a switching circuit during the first mode, an input node of the MTA decoder with a first output node of a first pulse amplitude modulation (PAM) decoder, the first output node for outputting a most significant bit for a first data symbol of a data set modulated according to PAM modulation and encoded using MTA coding;
operating the memory device in a second mode in which the MTA decoder for the memory array is enabled; and
coupling, using the switching circuit during the second mode, the input node of the MTA decoder with a second output node of a second PAM decoder, the second output node for outputting a least significant bit for a second data symbol of the data set.

22. The method of claim 21, further comprising:
isolating, during the first mode, the first PAM decoder from all but one receiver in a first set of receivers for the first PAM decoder, wherein each receiver in the first set of receivers is coupled with the first PAM decoder during the second mode; and
isolating, during the second mode, the second PAM decoder from all but one receiver in a second set of receivers for the second PAM decoder, wherein each receiver in the second set of receivers is coupled with the second PAM decoder during the second mode.

23. The method of claim 21, further comprising:
isolating the second output node of the second PAM decoder from the input node of the MTA decoder during the first mode.

24. The method of claim 21, further comprising:
receiving, at the MTA decoder during the first mode, a most significant bit of the second data symbol from the second PAM decoder; and
communicating the most significant bit of the first data symbol and the most significant bit of the second data symbol to the memory array without performing MTA decoding.

25. An apparatus, comprising:
a maximum transition avoidance (MTA) decoder coupled with a memory array;
a first pulse amplitude modulation (PAM) decoder coupled with the MTA decoder and comprising a first output node configured to output a most significant bit for a first data symbol of a data set;
a second PAM decoder coupled with the MTA decoder and comprising a second output node configured to output a least significant bit for a second data symbol of the data set; and
logic operable to cause a switching circuit to:
couple, during a first mode of the apparatus, an input node of the MTA decoder with the first output node of the first PAM decoder; and
couple, during a second mode of the apparatus, the input node of the MTA decoder with the second output node of the second PAM decoder.

26. The apparatus of claim 25, wherein the MTA decoder is configured to:
communicate, during the first mode, the most significant bit of the first data symbol to the memory array without performing MTA decoding.

27. The apparatus of claim 25, wherein the logic is operable to:
disable the MTA decoder during the first mode, wherein disabling the MTA decoder disables an MTA decoding functionality of the MTA decoder or disables an inversion stage of the MTA decoder.

28. An apparatus, comprising:
a maximum transition avoidance (MTA) decoder coupled with a memory array;
a first pulse amplitude modulation (PAM) decoder coupled with the MTA decoder;
a second PAM decoder coupled with the MTA decoder; and
logic operable to cause the apparatus to:
operate in a first mode in which the MTA decoder is disabled;
couple, during the first mode, an input node of the MTA decoder with a first output node of the first PAM decoder that is configured to output a most significant bit for a first data symbol of a data set modulated according to PAM modulation and encoded using MTA coding;
operate in a second mode in which the MTA decoder is enabled; and
couple, during the second mode, the input node of the MTA decoder with a second output node of the second PAM decoder that is configured to output a least significant bit for a second data symbol of the data set.

29. The apparatus of claim 28, further comprising:
a switching circuit coupled with the MTA decoder, wherein the logic is operable to cause the switching circuit to couple the input node of the MTA decoder with the first output node or the second output node based at least in part on an operating mode of the apparatus.

30. The apparatus of claim 28, further comprising:
a first set of receivers for the first PAM decoder; and
a second set of receivers for the second PAM decoder, wherein the logic is operable to:
isolate, during the first mode, all but one receiver in the first set of receivers from the first PAM decoder and all but one receiver in the second set of receivers from the second PAM decoder; and couple, during the second mode, the first set of receivers with the first PAM decoder and the second set of receivers with the second PAM decoder.

\* \* \* \* \*